US012574072B2

(12) United States Patent
Li

(10) Patent No.: US 12,574,072 B2
(45) Date of Patent: Mar. 10, 2026

(54) CIRCUIT STRUCTURE TO IMPROVE RELIABILITY OF POWER LINE COMMUNICATION

(71) Applicant: HK Oceancomm Technology Co., Limited, Wan Chai (HK)

(72) Inventor: Hsin-Hsien Li, Zhubei City (TW)

(73) Assignee: HK Oceancomm Technology Co., Limited, Wan Chai (HK)

( * ) Notice: Subject to any disclaimer, the term of this patent is extended or adjusted under 35 U.S.C. 154(b) by 166 days.

(21) Appl. No.: 18/605,041

(22) Filed: Mar. 14, 2024

(65) Prior Publication Data

US 2024/0313825 A1      Sep. 19, 2024

(30) Foreign Application Priority Data

Mar. 15, 2023 (TW) ................................. 112109611
May 8, 2023 (TW) ................................. 112117026
Jun. 6, 2023 (TW) ................................. 112121141

(51) Int. Cl.
*H04B 3/56* (2006.01)
*H03F 1/56* (2006.01)
*H03F 3/45* (2006.01)

(52) U.S. Cl.
CPC .............. *H04B 3/56* (2013.01); *H03F 1/565* (2013.01); *H03F 3/45475* (2013.01); *H03F 2200/271* (2013.01)

(58) Field of Classification Search
CPC .... H04B 3/56; H04B 3/54; H04B 2203/5483; H04B 2203/5491; H04B 3/542; H04B 2203/5441; H03F 1/565; H03F 3/45475; H03F 2200/271
See application file for complete search history.

(56) References Cited

U.S. PATENT DOCUMENTS 6,933,835 B2 * 8/2005 Kline ..................... H02G 11/02
398/116
6,980,090 B2 * 12/2005 Mollenkopf ............. H04B 3/56
375/259
2004/0227621 A1 * 11/2004 Cope .................... H04M 11/066
370/487
2005/0116814 A1 * 6/2005 Rodgers .................... H02J 3/14
340/538

* cited by examiner

*Primary Examiner* — Khanh C Tran
(74) *Attorney, Agent, or Firm* — MUNCY, GEISSLER, OLDS & LOWE, P.C.

(57) ABSTRACT
A circuit structure to improve reliability of power line communication has a power line, on which a power energy wave and a network signal are transmitted. The circuit structure includes: a first isolator, which is disposed at an entrance of a power consumption terminal of the circuit structure, separates the power line into the power consumption terminal and a transmission terminal, and filters the network signal, so that the power energy wave enters the power consumption terminal; and a first coupler for generating a first coupling path, through which the network signal enters the transmission terminal via the first coupler without passing through the first isolator. Power line impedance at a side of the transmission terminal is not affected by a side of the power consumption terminal.

14 Claims, 17 Drawing Sheets

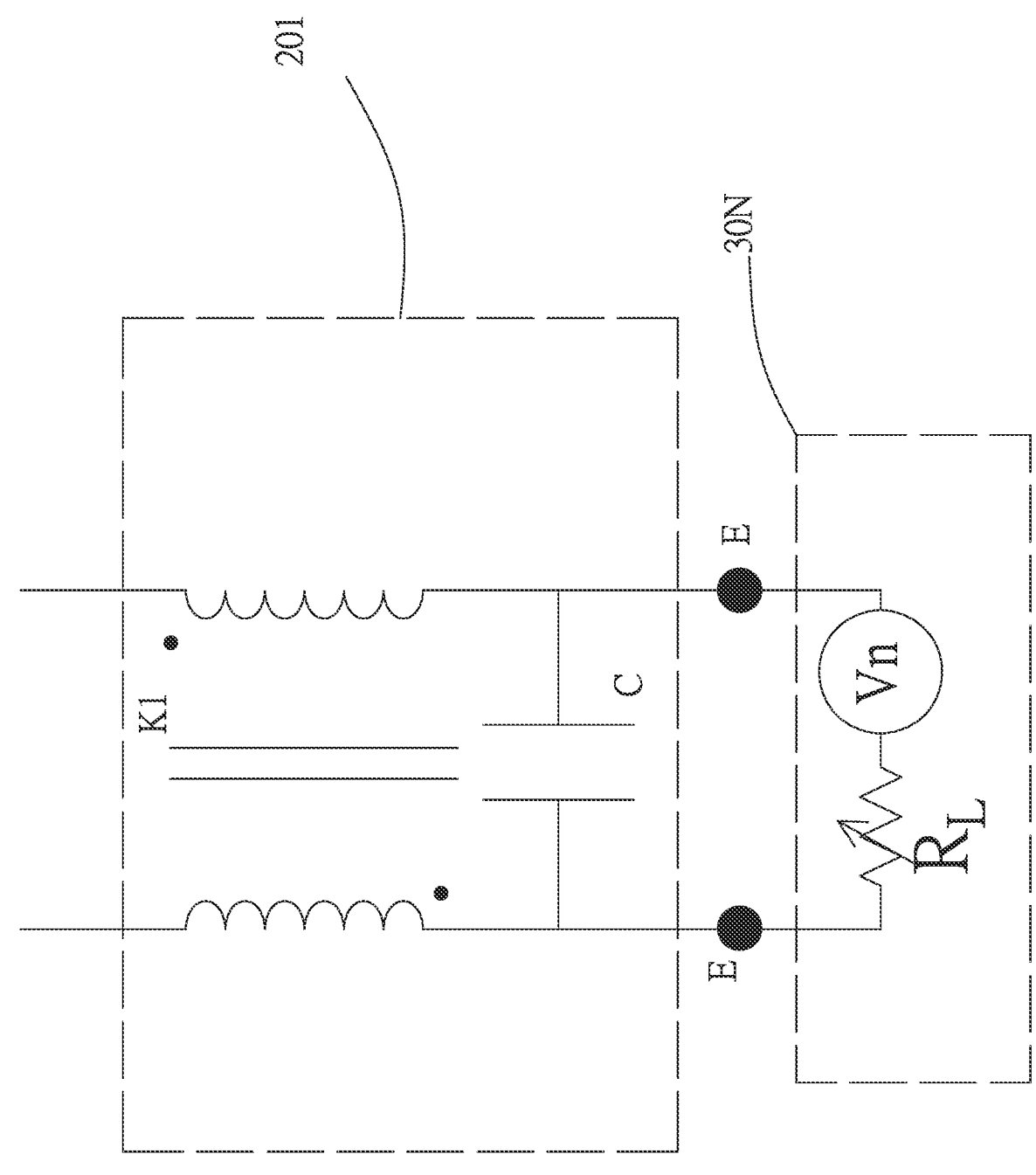
FIG. 3A1

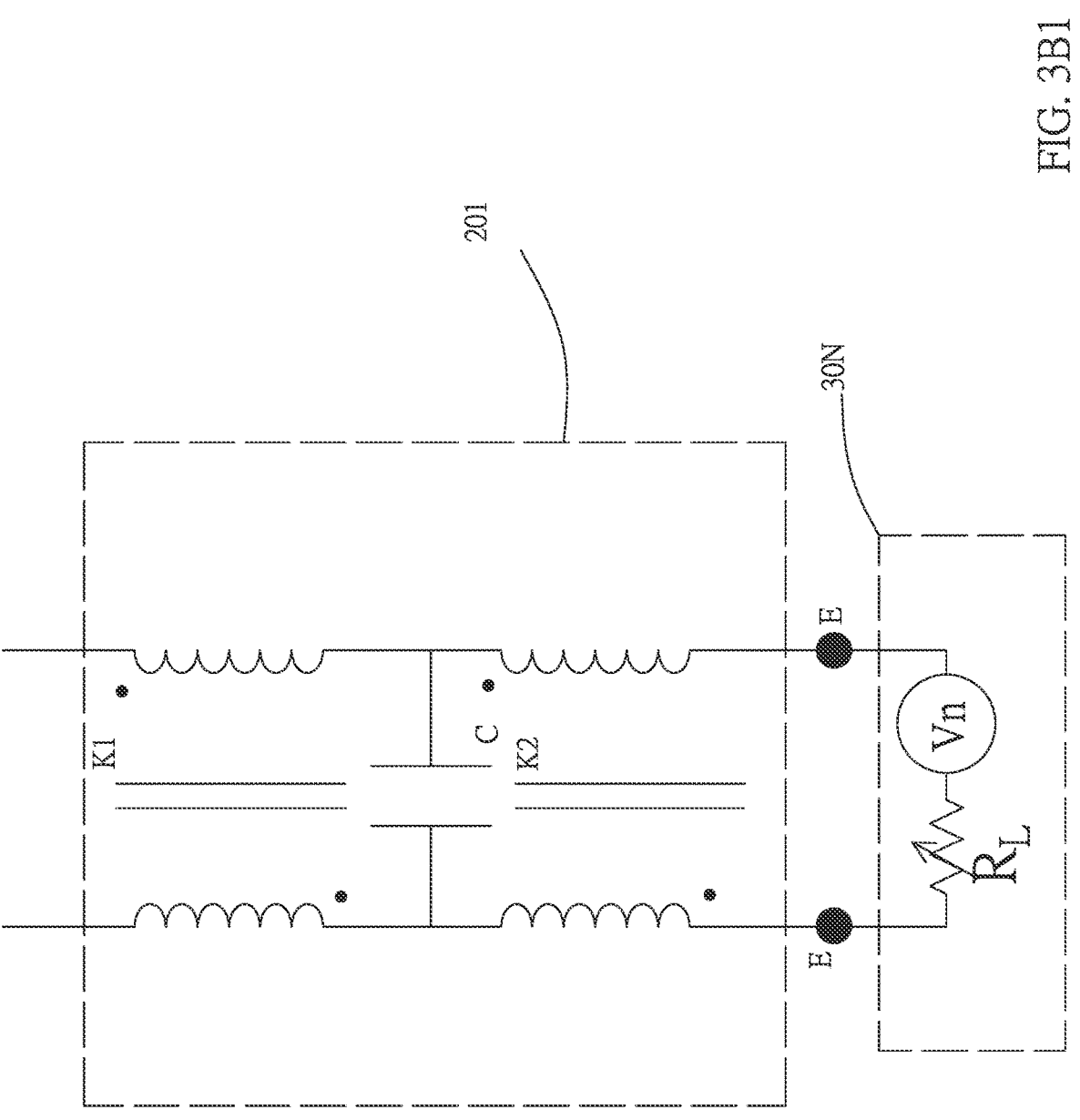
FIG. 3B1

CIRCUIT STRUCTURE TO IMPROVE RELIABILITY OF POWER LINE COMMUNICATION

CROSS-REFERENCE TO RELATED APPLICATIONS

This application claims priorities of Nos. 112109611, 112117026 and 112121141 respectively filed in Taiwan R.O.C. on Mar. 15, 2023, May 8, 2023 and Jun. 6, 2023 under 35 USC 119, the entire contents of which are hereby incorporated by reference.

FIELD OF THE INVENTION

This disclosure relates to power line communication (PLC), and more particularly to a device of optimizing power line communication and an operation method thereof. The associated method may also be applied to wired communication applications using twisted pairs or coaxial cables.

DESCRIPTION OF RELATED ART

The PLC has been widely used in many fields since the end of 1990, for example, HomePlug AV standard, Generation 3rd Power Line Communication (G3-PLC), High Speed PLC (HPLC) and the like. Because the power grid usually has the problems including the high noise and impedance varying with time and the like, the communication quality thereof generally becomes poor. In view of this, this disclosure proposes a new architecture capable of significantly improving the above-mentioned problems.

Previously, a low-pass filter or an isolator is utilized in some applications to separate the power line into several sections, so that the influence range of the power consumption apparatus is reduced. However, the power consumption unit and the communication unit are still concurrently present on the isolated power line, and noise and impedance variations generated by the power consumption unit still affect the communication quality of this section of the power line. In addition, FIG. 1 is a schematic view showing a circuit structure 10 of a conventional intelligent electricity meter, wherein a communication unit 11 receives and transmits a power line signal through a coupler, a billing unit 12 calculates and analyzes associated power consumption data according to the power line signal, and a high-voltage alternating current to low-voltage direct current (AC-DC) power supply unit 15 extracts a power energy wave from the power line to provide the electric direct current (DC) power required by the communication unit and a billing unit. Therefore, the noise and impedance variations of a conventional power consumption unit 13 and the conventional AC-DC power supply unit 15 affect the communication quality of the communication unit 11.

SUMMARY OF THE INVENTION

This disclosure discloses a circuit structure to improve reliability of power line communication and to significantly improve the communication quality of the power line. Because the power line functions as the necessary path for powering the terminal power consumption apparatus on the power grid, the communication signal may also be transmitted using the frequency band much higher than the power supply frequency (DC or 50/60 Hz). Generally speaking, however, the conventional power line communication (PLC)

has two big problems causing the poor communication quality. First, the noise generated by the power consumption apparatus, including the modem itself, enters the power line, so that the power line is full of the time-varying noise, and the stable and reliable communication quality cannot be obtained. Second, the impedance on the power line also changes with time as the power consumption mode of the power consumption facility changes. In addition, once the heavy load (low impedance) state is present, the transmission signal transmitted onto the power line is highly attenuated, and it is difficult to transmit the transmission signal for a longer distance.

The concept of this disclosure is to dispose a low-pass filter or an isolator in front of the power consumption unit, including a modem itself. The low-pass 3 dB frequency turning point of this filter is much lower than the communication signal, so that the communication signal can be isolated without affecting the power supply and the power line can be separated into two sections, one of which is a transmission terminal, and the other of which is a power consumption terminal. The communication signal of the modem (communication unit) at the transmission terminal bypasses this filter through a coupler, and enters the transmission terminal of the power line. Consequently, with regard to the frequency band used by the communication signal of the communication unit, the time-varying noise and the time-varying impedance are isolated at the power consumption terminal, and the transmission terminal becomes the transmission medium with the stable impedance and the low noise, so that the communication effect can be significantly improved. In addition, if the power supply apparatus on the power grid is disposed at the terminal where the communication frequency band generates the noise or the low impedance is present, similar filters also need to be added at the exit and the entrance of the power supply apparatus to prevent the communication signal from the interference or from being highly attenuated on the power line.

This disclosure also discloses a circuit structure to improve reliability of power line communication, wherein the circuit structure has a power line, on which a power energy wave and a network signal are transmitted. The circuit structure includes a first isolator and a first coupler. The first isolator is disposed at an entrance of a power consumption terminal of the circuit structure. The first isolator separates the power line into the power consumption terminal and a transmission terminal, and filters the network signal, so that the power energy wave enters the power consumption terminal. The first coupler generates a first coupling path, through which the network signal enters the transmission terminal via the first coupler without passing through the first isolator. Power line impedance at a side of the transmission terminal is not affected by power consumption at a side of the power consumption terminal.

BRIEF DESCRIPTION OF DRAWINGS

FIGS. 3A, 3A1, 3B, 3B1, 3C, 3D, 3E, 3F, 3G, 3H, and 3I are schematic views showing an isolator 201 or 14.

DETAILED DESCRIPTION OF THE INVENTION

Figure 2A:
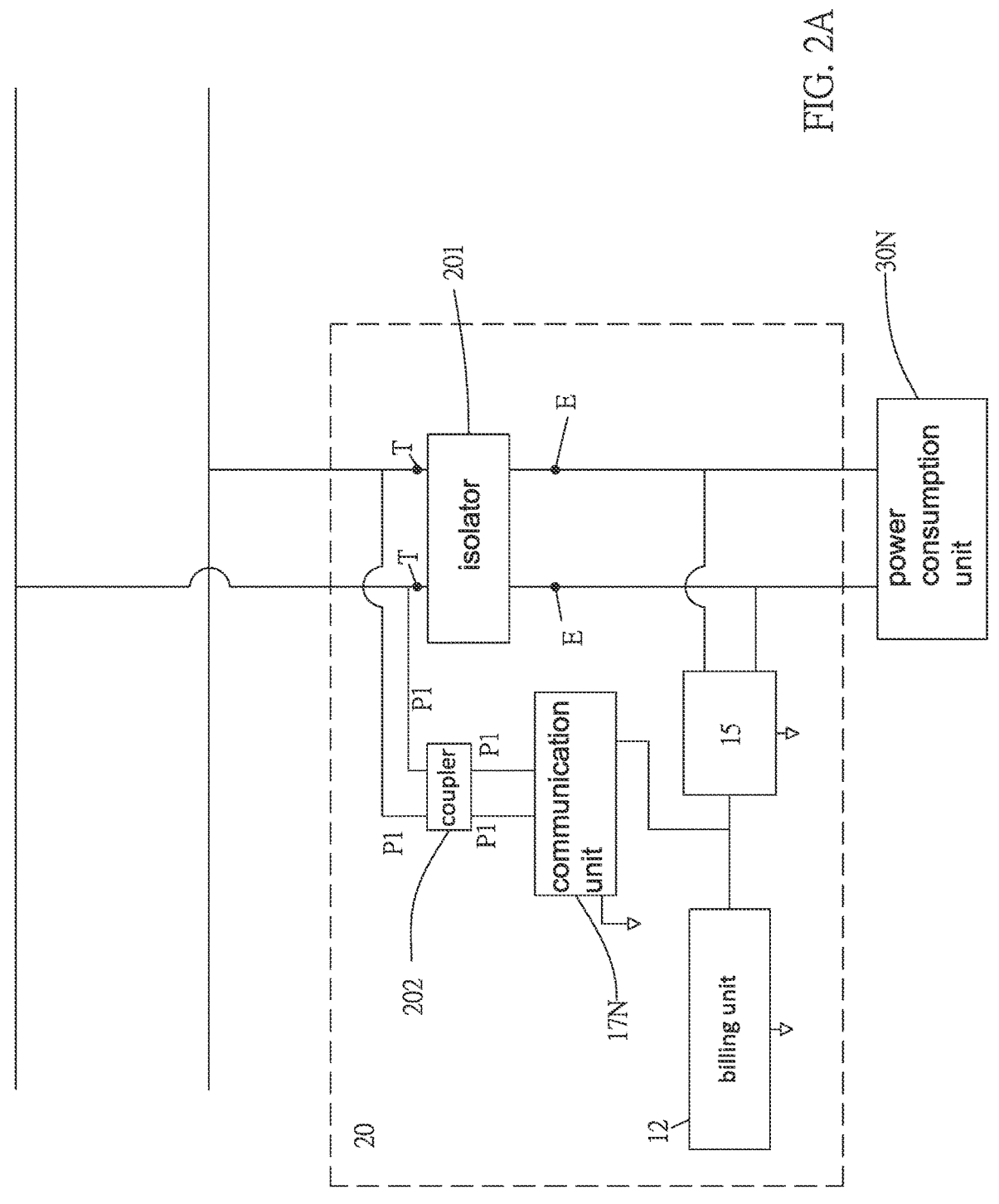
FIGS. 2A and 2B are schematic views showing an embodiment of a circuit structure of this disclosure.

FIG. 2A is a schematic view showing a circuit structure of this disclosure used in an electricity meter 20. Referring to FIG. 2A, with regard to the low-voltage power supply networks mostly disposed on the current intelligent grids, the electricity meter 20 is the entrance of each electricity user. If the electricity meter is improved, then the success rate of communication of the low-voltage power supply network can be effectively improved. The electricity meter 20 of this disclosure includes an isolator 201, a billing unit 12, a coupler 202, a communication unit 17N and a high-voltage alternating current to low-voltage direct current (AC-DC) power supply unit 15. The billing unit 12 calculates and analyzes associated power consumption data according to a power line signal. The high-voltage alternating current to low-voltage direct current (AC-DC) power supply unit 15 coupled to a power consumption terminal extracts a power energy wave of the power consumption terminal to provide electric DC power required by the billing unit 12 and the communication unit 17N of the transmission terminal. Please note that a communication signal of the communication unit 17N bypasses the isolator 201 through a coupling path P1 via the coupler 202, so that the communication signal enters the communication unit 17N on the power line.

The electricity meter 20 of one embodiment includes one billing unit 12. The billing unit 12 is disposed between a first isolator 201 and a power consumption unit 30N, and performs billing according to the power energy wave generated after the first isolator 201 filters the network signal.

In one embodiment, the billing unit 12 is coupled to the communication unit 17N, and data of the billing unit 12 of the electricity meter 20 can be uploaded to the cloud through the communication unit. The objective thereof is to manage the energy usage and billing more effectively. The electricity meter 20 can transmit data, including messages of electricity consumption, power consumption time, load peaks and the like, to a cloud data center (power station) in a real-time manner using the Internet technology and cloud calculation.

Figure 2B:
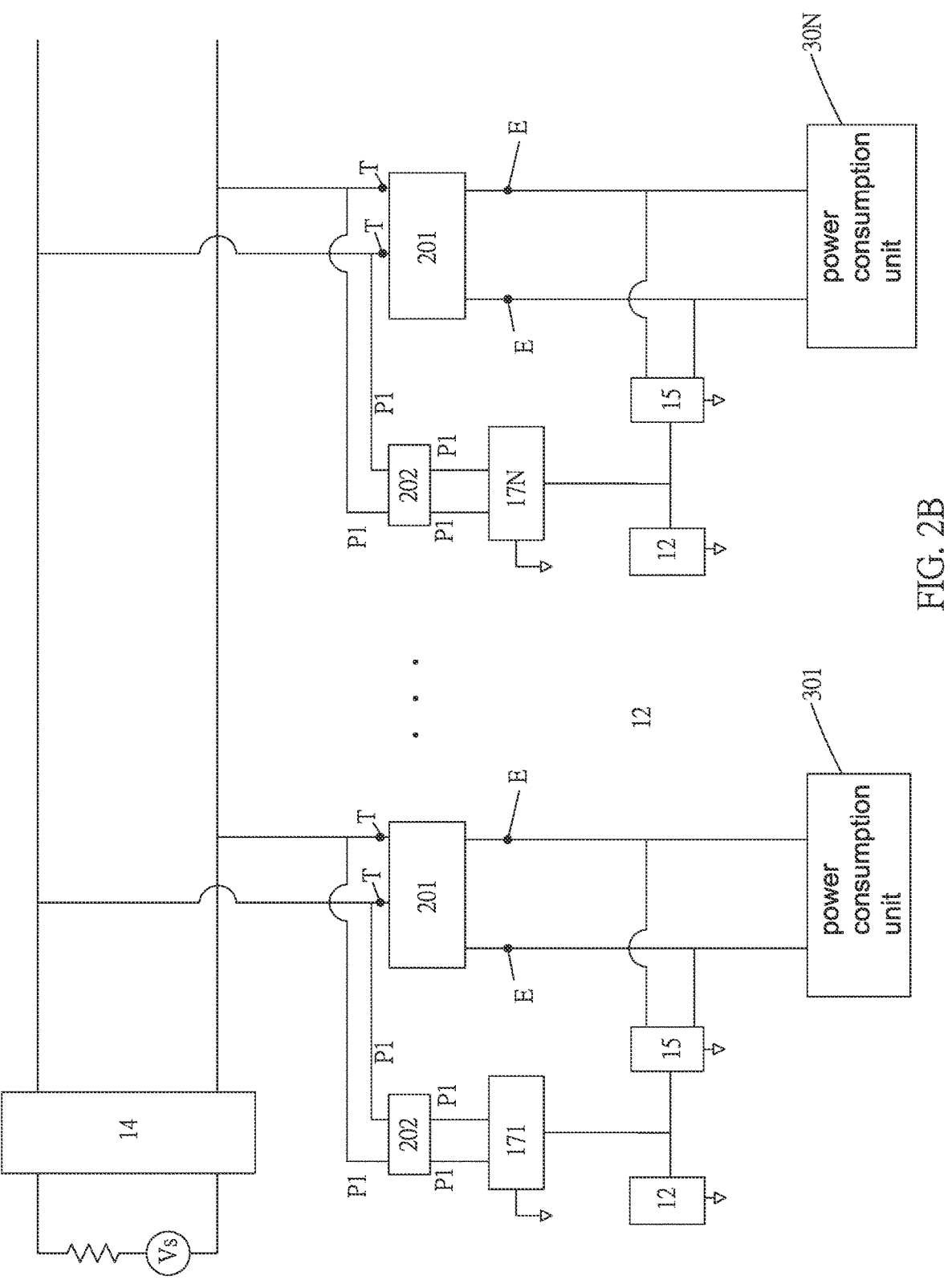

FIG. 2B is a schematic view showing the isolator 201 and the coupler 202 in one embodiment of this disclosure. Referring to FIGS. 2A and 2B, an isolator 14 is an isolator close to the power terminal, and is implemented by a low frequency low-pass filter or an active isolator. The network signal is transmitted to entrances of communication units 171 to 17N (or transmission terminal T) through the coupling path P1, but cannot enter a side of a power consumption terminal E (or the power consumption terminal E side) through the isolator 201, while the low-frequency power energy wave can pass through the isolator 201 and then enter the side of the power consumption terminal E, and the power energy wave provides energy to power consumption units 301 to 30N. In this embodiment, the isolator 201 may be implemented by a low frequency low-pass filter or an active isolator.

The new architecture proposed in this disclosure is to dispose an additional low-pass filter (the active isolator may also be regarded as a low-pass filter) at an entrance of each or some of the power consumption units (e.g., 30N) of the power line communication (PLC) device. The 3 dB cut-off frequency of the filter falls at the very low frequency (see FIGS. 2A and 2B) with respect to the communication signal.

In one embodiment, the cut-off frequency of the isolator 201 is lower than the transmission frequency of the network signal, and higher than a frequency of the power energy wave. So, only a very little proportion of the noise generated by the power consumption unit 30N can enter the frequency band of the communication signal through the isolator 201, and the communication signal itself needs to bypass the isolator 201 through the coupling path P1 and enter the communication unit 17N. In other words, time-varying noise and impedance generated by the power consumption unit 30N cannot affect the communication.

Figure 3A:
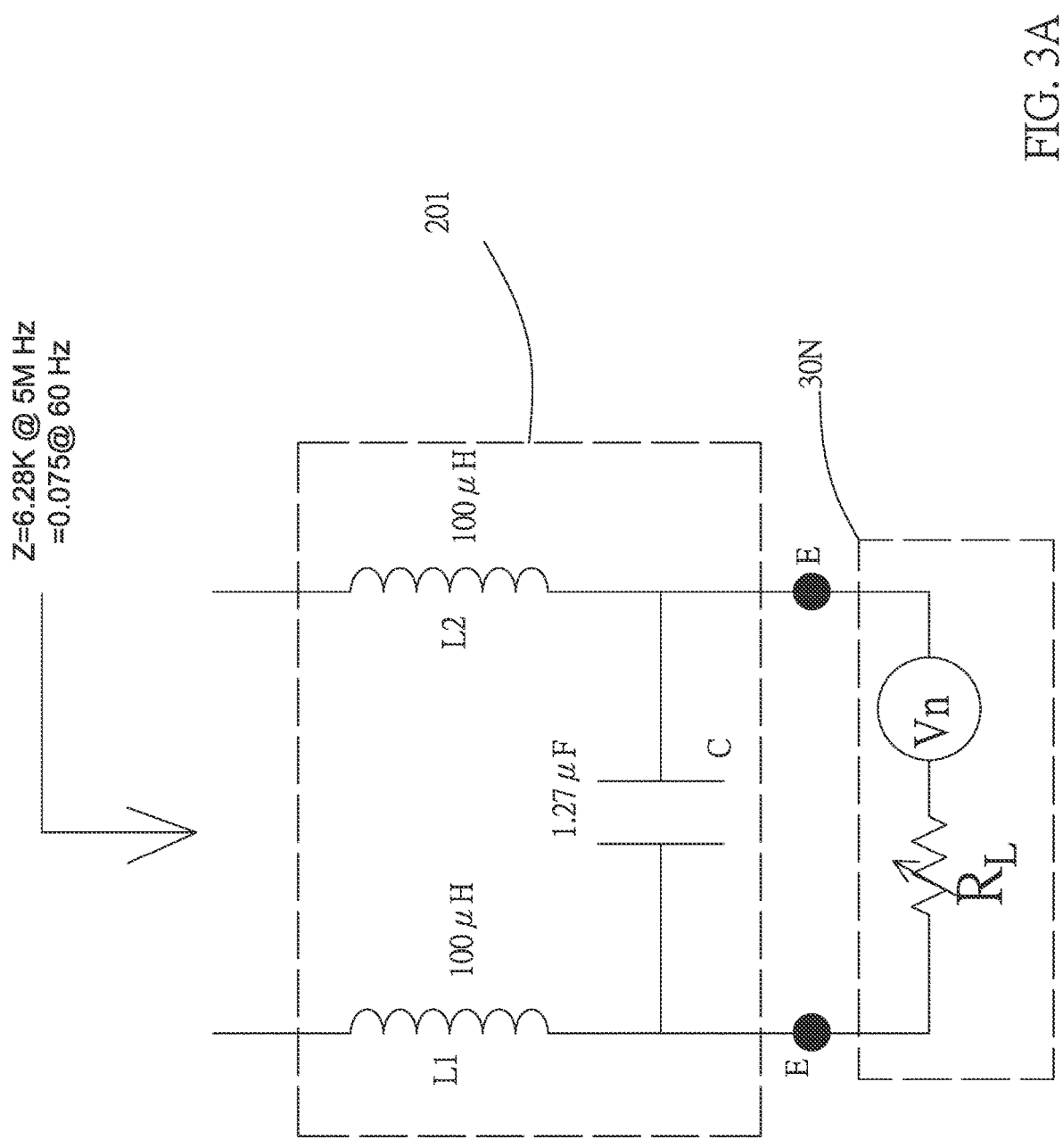

This architecture has another advantage to be described in the following. The isolator 201 is configured to be a circuit serially connected to the high impedance in the communication frequency band with respect to the transceiver. So, the communication signal transmitted from the transceiver to the power line cannot be easily attenuated, and the time-varying degree is low, so that the stable and good communication quality can be held. FIG. 3A shows an embodiment of the isolator 201 being a low frequency low-pass filter. Referring concurrently to FIG. 3A, the isolator 201 in this embodiment includes two inductors L1 and L2, and a capacitor C, wherein the power line is serially connected to the inductors L1 and L2, and parallelly connected to the capacitor C.

Please note that the inductors L1 and L2 are disposed at the entrance of the input terminal of the isolator 201. In other words, the inductors L1 and L2 are disposed on an outer side of the capacitor C. That is, the capacitor C is disposed between the inductor L1 or L2 and the power consumption unit 30N. Consequently, when the angular frequency is equal to w, the impedance of the power consumption terminal E facing the signal outputted from the transmission terminal T approaches $\omega L1 + \omega L2$, and the value of which is almost kept unchanged. In other words, the power line impedance at the side of the transmission terminal T (or the transmission terminal T side) cannot change with the change of the power consumption behavior at the side of the power consumption terminal E. So, the side of the transmission terminal T becomes a stable transmission medium, and the attenuation amount of the communication signal at the side of the transmission terminal T is not affected by the power consumption behavior of the power consumption terminal E.

It is assumed that the inductance values of the inductors L1 and L2 are equal to 100 pH and the capacitance is equal to 1.27 μF. If the frequency of the alternating current (AC) signal is equal to 60 Hz, then the inductor of the low-pass filter (isolator 201) has the impedance equivalent to 0.075 ohms and does not affect the usage of the normal electric power. If the network signal falls at about 5 MHZ, then the impedance facing the network signal is equal to about 6,280 ohms, and the network signal is not affected by the impedance $R_L$ of the power consumption unit 30N. Meanwhile, only a little proportion of the noise's equivalent voltage Vn generated by the power consumption unit 30N can pass through the low frequency low-pass filter (isolator 201) and affect the network signal. If there is a power unit present on the power line, then the low frequency low-pass filter (isolator 14) is generally needed at the power output terminal to improve the transmission line (or cable) impedance (see FIG. 2B).

Figure 3B:
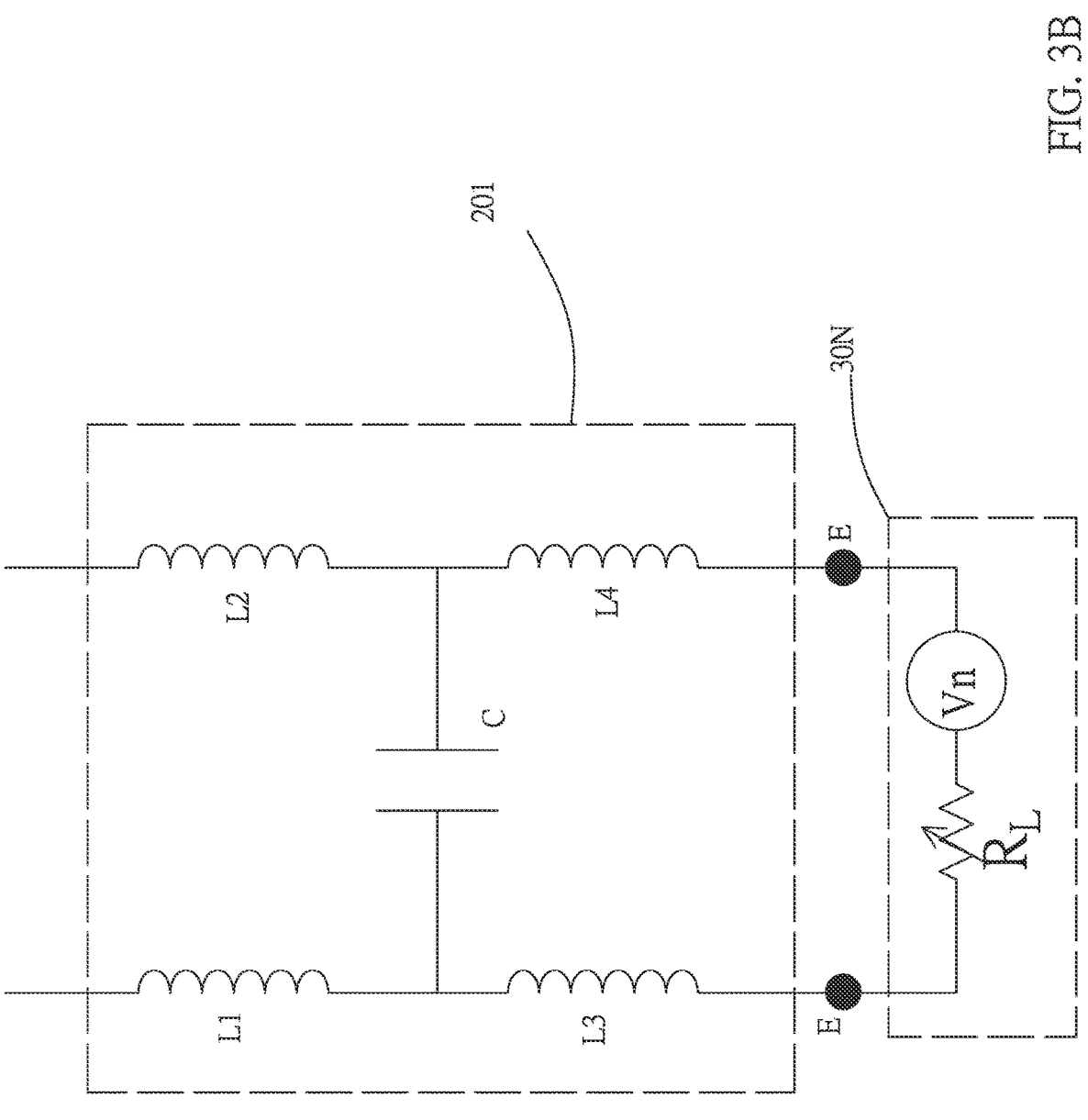

FIG. 3B shows another embodiment, in which the isolator 201 is the low frequency low-pass filter. Referring to FIG. 3B, the isolator 201 in this embodiment includes four inductors L1, L2, L3 and L4, and a capacitor C. The inductors L1 and L3 are serially connected to the power line, and the inductors L2 and L4 are serially connected to the power line. The inductors L1 and L2 are disposed on an outer side of the capacitor C. The capacitor C is parallelly connected to the power line, and disposed between the inductors L1 and L2 and the power consumption unit 30N, wherein the other principles are the same as those mentioned hereinabove. If the noise source energy at the power consumption side is very strong and the internal resistance at the power consumption side is lower, then the low frequency low-pass filter of FIG. 3B or even the more advanced low frequency low-pass filter has the better isolation effect.

Figure 1:
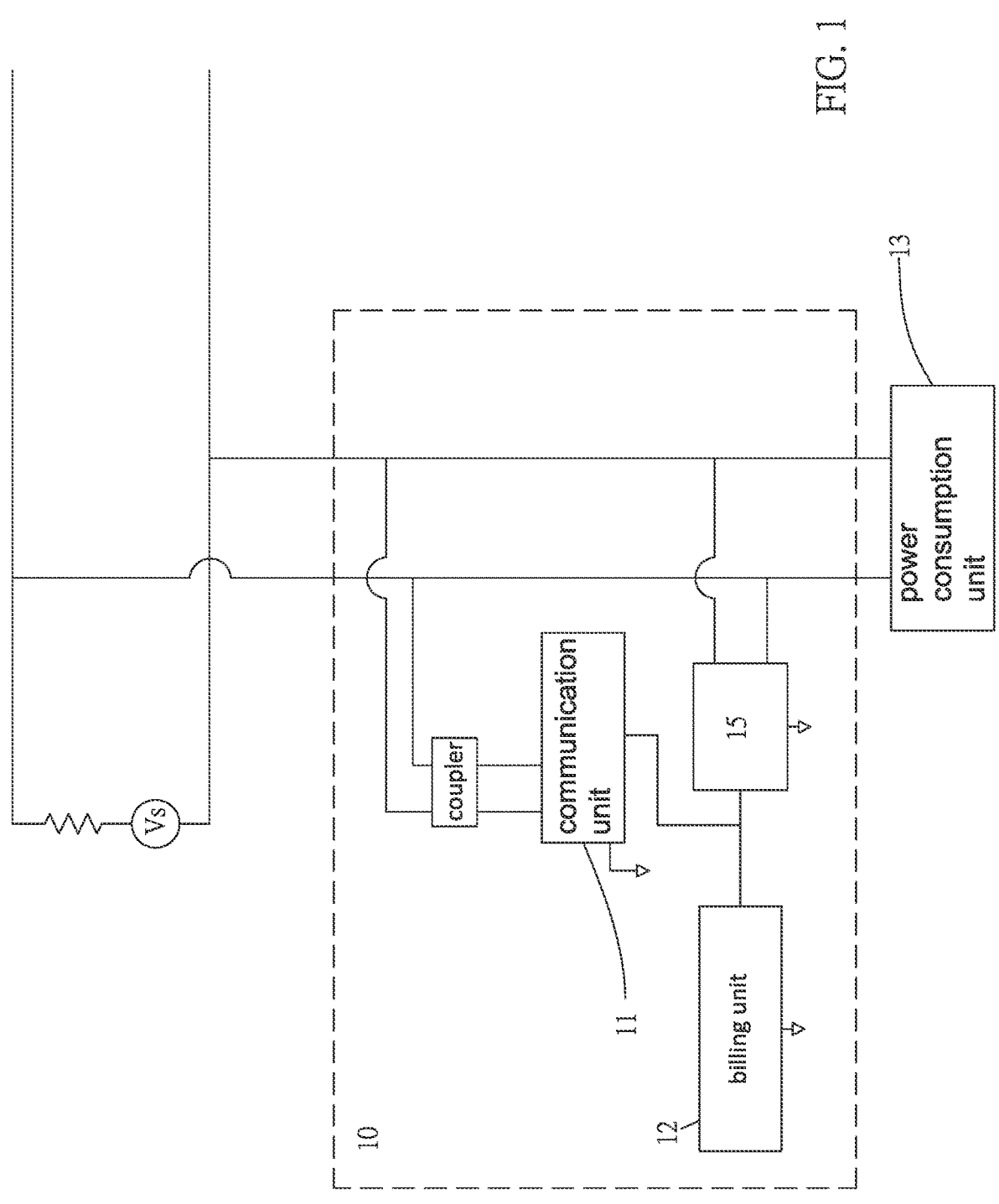
FIG. 1 shows the prior art.

Please note that the isolator may be implemented by a low-pass filter, and the advantage is that the design becomes easy. However, the application scene, such as an electricity meter, having the high current needs the large-size and high-cost inductor and the high-voltage capacitor also having the similar problem. So, a lower-cost solution is to adopt a reversely connected transformer to replace the inductor, as shown in FIGS. 3A1 and 3B1. FIGS. 3A1 and 3B1 are schematic views respectively showing isolators in one embodiment. In FIG. 3A1, the transformer K1 is serially connected to the power line, and a capacitor is parallelly connected to the power line. The transformer K1 is disposed at an entrance of an input terminal of the isolator 201, or the transformer K1 is disposed on an outer side of the capacitor C, so that the power energy wave firstly passes through the transformer K1 and is then transmitted to the power consumption terminal E. In FIG. 3B1, the transformers K1 and K2 are respectively serially connected to the power line, and the capacitor C is parallelly connected between the power line and the transformers K1 and K2. The transformers K1 and K2 are disposed at an entrance of an input terminal of the isolator 201, or the transformer K1 is disposed on an outer side of the capacitor C, so that the power energy wave firstly passes through the transformers K1 and K2 and is then transmitted to the power consumption terminal E.

Figure 3C:
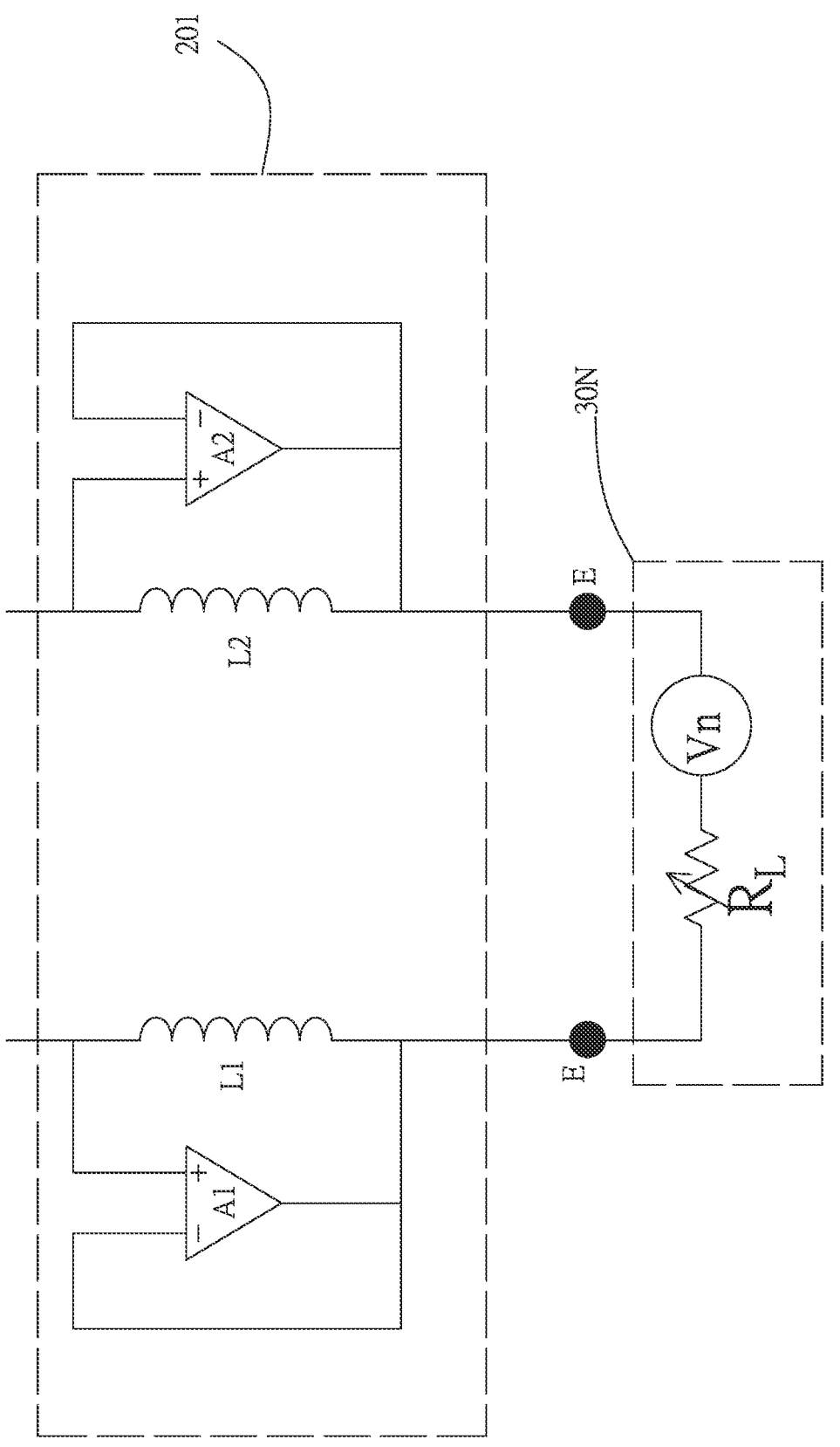

Another approach of dramatically improving the isolation effect uses an active isolator to reduce the requirement on the transformer or the inductance value, as shown in FIGS. 3C to 3I. FIG. 3C shows a basic concept of an active isolator, wherein each isolator 201 includes inductors L1 and L2 and amplifiers A1 and A2. The inductors L1 and L2 are respectively serially connected to the power line. The amplifiers A1 and A2 are respectively coupled to two sides of the inductors L1 and L2. The noninverting input terminals of the amplifiers A1 and A2 are respectively coupled to starting terminals of the inductors L1 and L2, output terminals of the amplifiers A1 and A2 are respectively coupled to the inverting input terminals of the amplifiers A1 and A2 and ending terminals of the inductors L1 and L2, and the noninverting input terminals of the amplifiers A1 and A2 are coupled to the starting terminals of the inductors L1 and L2. The inductors L1 and L2 can detect the potential change in the communication frequency band through the higher current at the low frequency. The voltage difference between two sides of the inductor can be reduced to (1/A) times through the amplifiers A1 and A2 having the gain (A), and the equivalent impedance of the isolator 201 can be increased to (A) times, so that the desired effect can be obtained using the very small inductor. In one embodiment, each of the amplifiers A1 and A2 is implemented by a voltage follower. In addition, the low impedance is seen at the lower sides of the inductors L1 and L2 (i.e., the power consumption terminal E side), and the noise current generated by the power consumption side can be absorbed to achieve effects of isolating the noise and holding the high impedance at the upper sides of the inductors L1 and L2 (i.e., the transmission terminal T side).

Figure 3D:
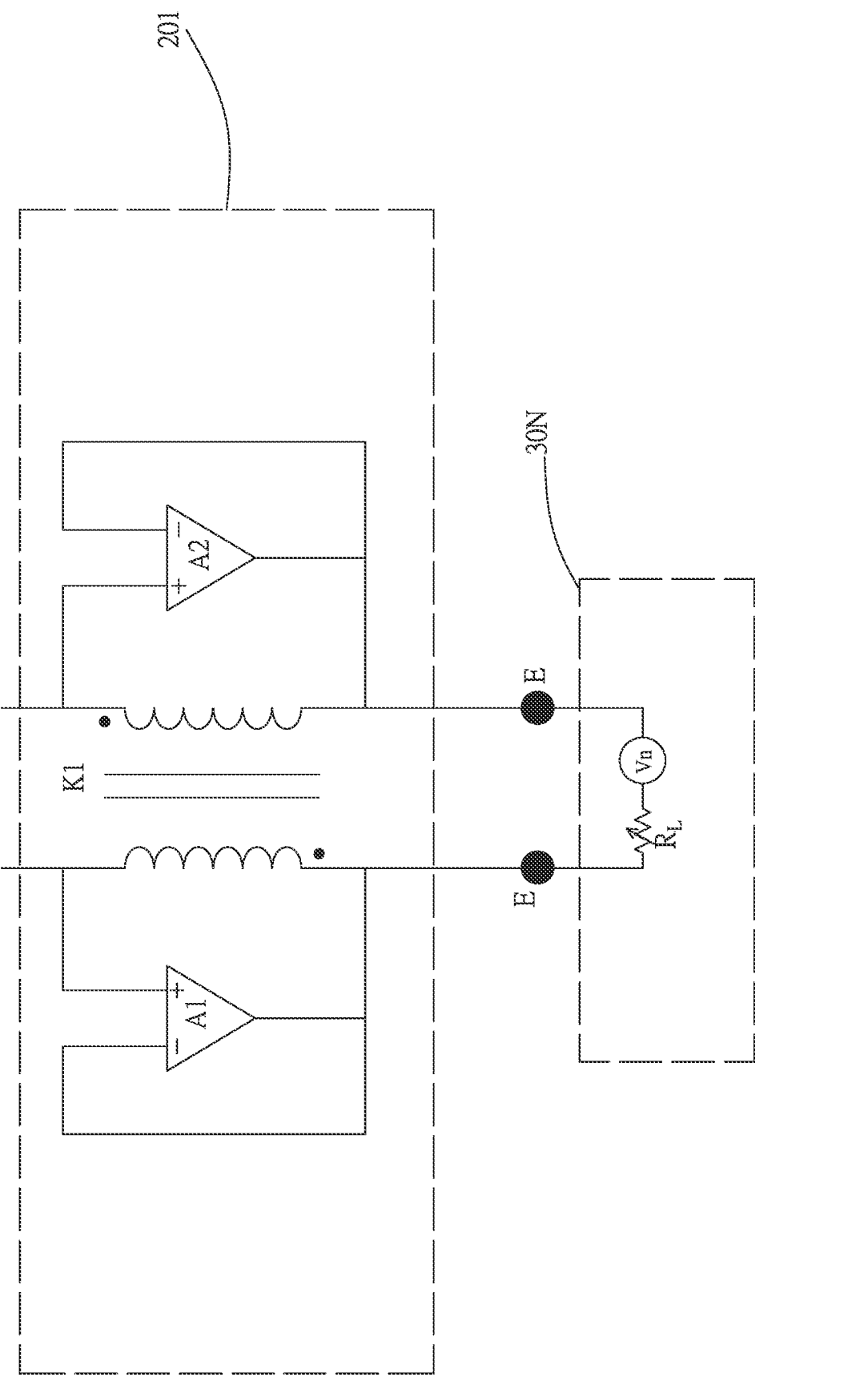

In FIG. 3D, the inductor is replaced with the transformer K1 because the core is shared, and the cost thereof may be further decreased. In addition, because the actual impedance of the reverse mutual induction can be higher than that of the simple induction, the isolator of this embodiment includes: a transformer K1 serially connected to the power line; and two amplifiers A1 and A2 respectively coupled to the starting terminal of the primary-side coil and the starting terminal of the secondary-side coil of the transformer K1. The output terminals of the amplifiers A1 and A2 are respectively coupled to the inverting input terminals of the amplifiers A1 and A2, and the ending terminal of the primary-side coil or the ending terminal of the secondary-side coil of the transformer K1. The noninverting input terminals of the amplifiers A1 and A2 are respectively coupled to the starting terminal of the primary-side coil and the starting terminal of the secondary-side coil of the transformer K1.

Figure 3E:
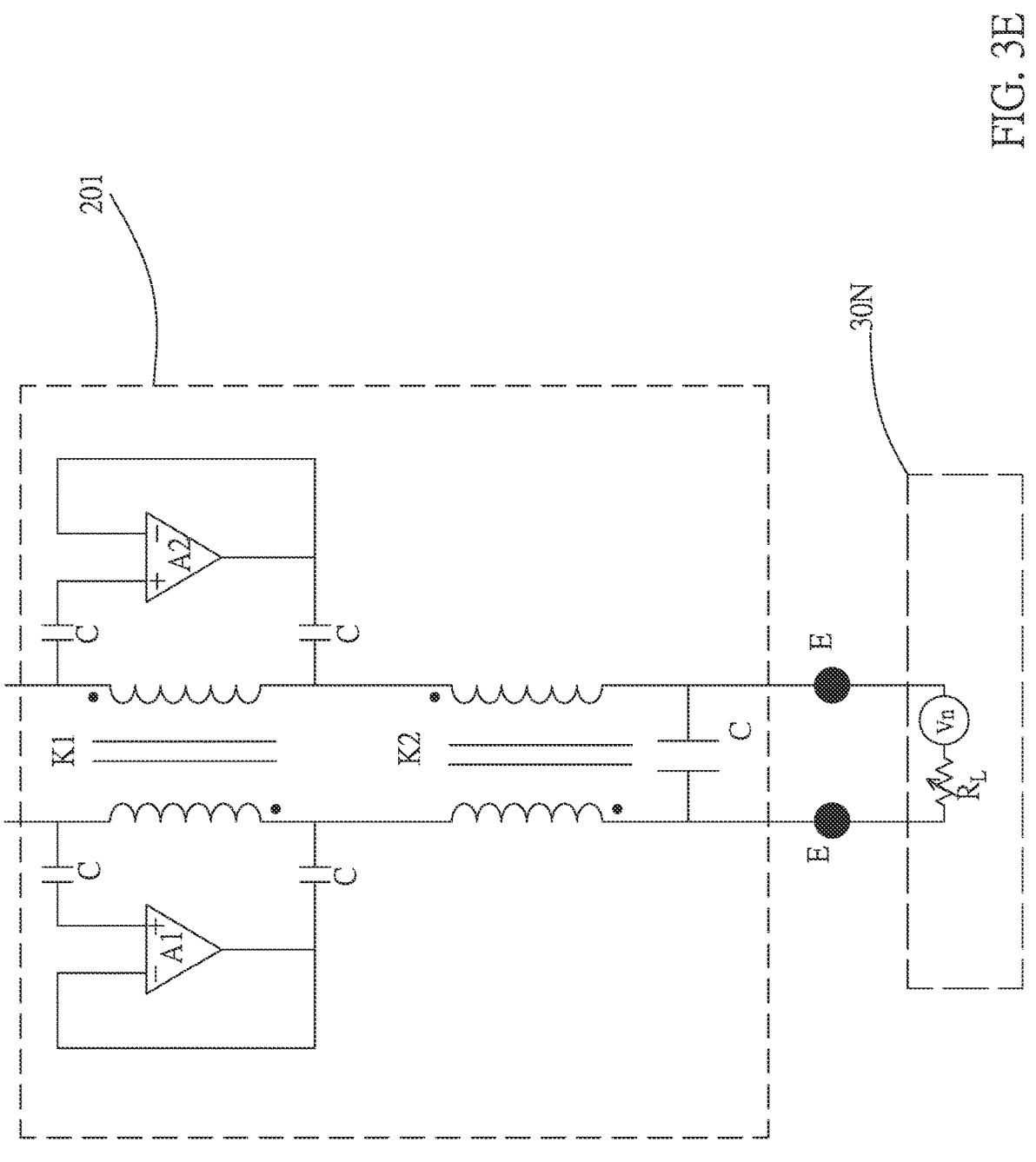

In actual use, another transformer K2 or a low-pass filter may be placed between the output terminals of the amplifiers A1 and A2 and the side of the power consumption terminal E to reduce the specification requirements on the maximum current outputs of the amplifiers A1 and A2, as shown in FIG. 3E. The isolator of this embodiment includes: two transformers K1 and K2 respectively serially connected to the power line; and two amplifiers A1 and A2 respectively coupled to the starting terminal of the primary-side coil and the starting terminal of the secondary-side coil of the transformer K1. The output terminals of the amplifiers A1 and A2 are respectively coupled between the inverting input terminals of the amplifiers A1 and A2, and the two transformers K1 and K2. The noninverting input terminals of the amplifiers A1 and A2 are respectively coupled to the starting terminal of the primary-side coil and the starting terminal of the secondary-side coil of the transformer K1. Because it is used in an electricity meter, the power line at the high-voltage side is parallelly connected to a high-voltage capacitor C. That is, the high-voltage capacitor C is parallelly connected between the ending terminal of the primary-side coil and the ending terminal of the secondary-side coil of the transformer K2 and the power line, and parallelly connected between the starting terminal of the primary-side coil or the starting terminal of the secondary-side coil of the transformer K1, the noninverting input terminals of the amplifiers A1 and A2 and the power line. Capacitors C are respectively parallelly connected between the ending terminal of the primary-side coil or the ending terminal of the secondary-side coil of the transformer K1, the inverting input terminals and the output terminals of the amplifiers A1 and A2 and the power line.

Figure 3F:
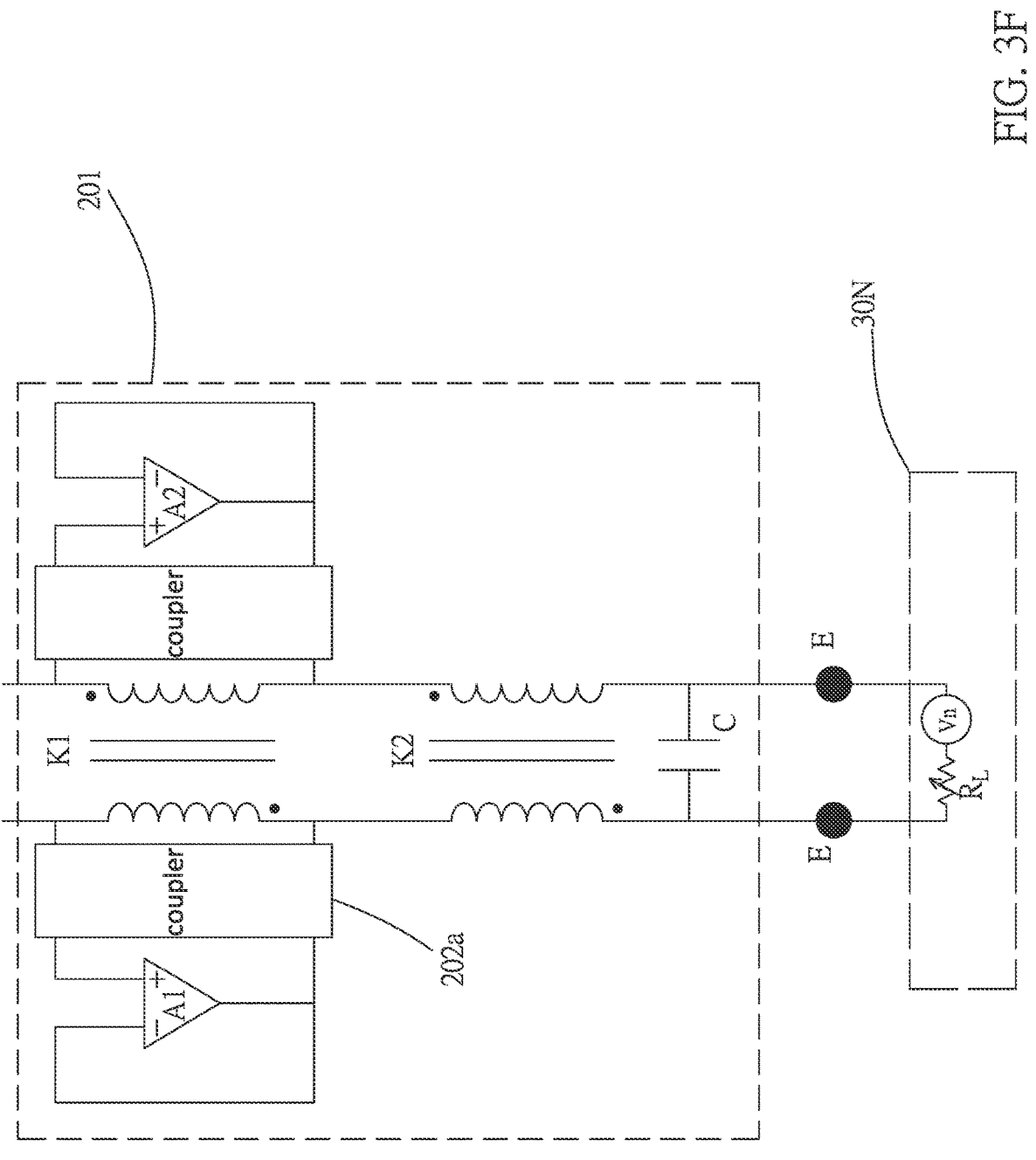

In addition, considering the presence of the voltage on the power line upon the practical application, a coupling circuit needs to be disposed between the amplifier circuit and the transformer (or inductor). In this embodiment, as shown in FIG. 3F, the path of the coupling circuit is generated through a coupler 202a. The isolator of this embodiment includes: two transformers K1 and K2 respectively serially connected to the power line; and two amplifiers A1 and A2 respectively coupled to the starting terminal of the primary-side coil and the starting terminal of the secondary-side coil of the transformer K1. The output terminals of the amplifiers A1 and A2 are respectively coupled between the inverting input terminals of the amplifiers A1 and A2, and the two transformers K1 and K2. The noninverting input terminals of the amplifiers A1 and A2 are respectively coupled to the starting terminal of the primary-side coil and the starting terminal of the secondary-side coil of the transformer K1. The power line at the high-voltage side is parallelly connected to a high-voltage capacitor C. That is, the high-voltage capacitor C is parallelly connected between the ending terminal of the primary-side coil and the ending terminal of the secondary-side coil of the transformer K2, and the power line. Two couplers 202a are respectively coupled to the starting terminal and the ending terminal of the transformer K1, and the output terminals, the noninverting input terminals and the inverting input terminals of the amplifiers A1 and A2, and are respectively disposed between the amplifiers A1 and A2 and the transformer K1.

Figure 3G:
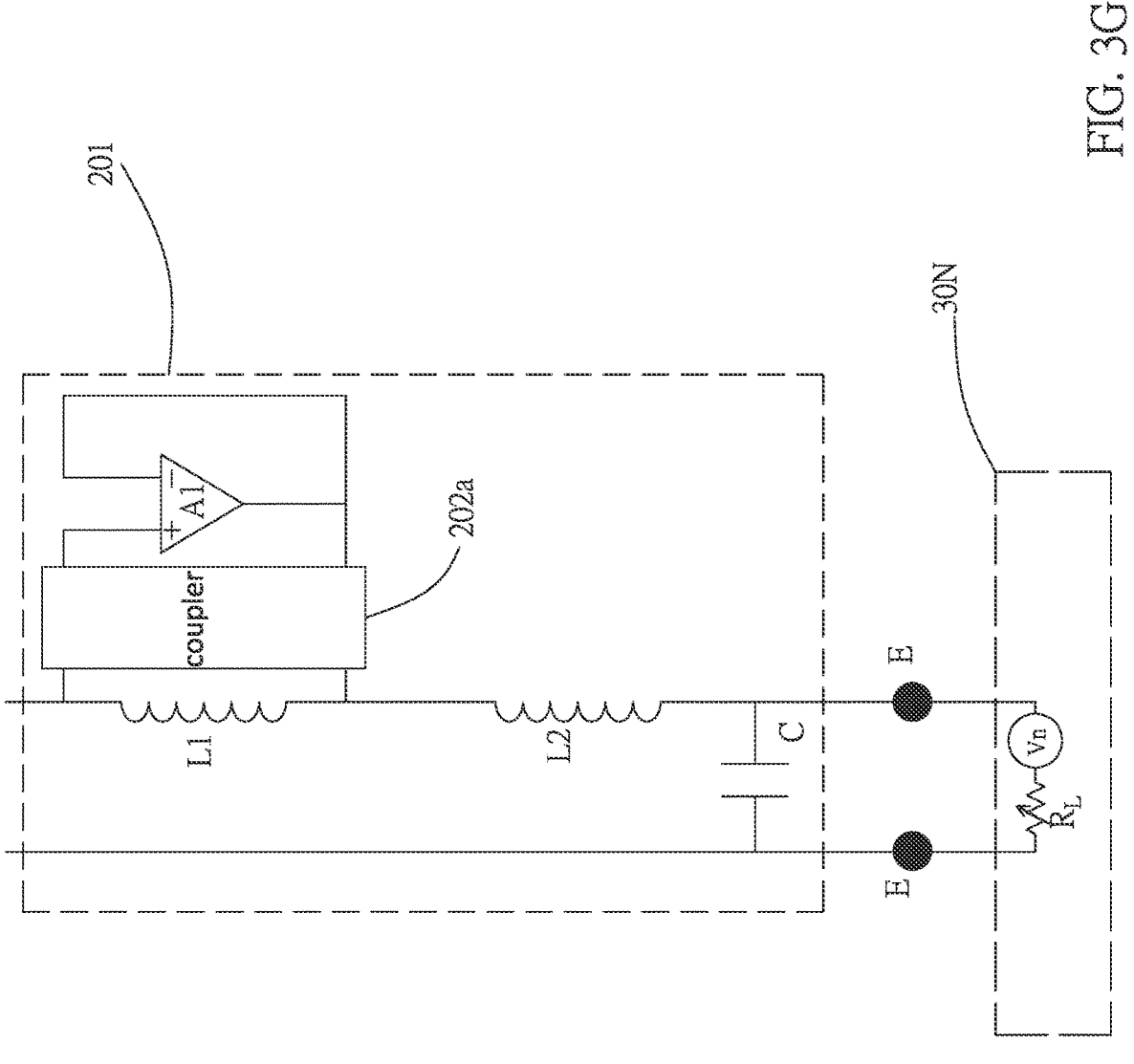

On the in-vehicle low-voltage power line, the coupling circuit may be implemented by a capacitor. In the application of the electricity meter, the coupling circuit is frequently implemented by a transformer, and the original coupling transformer at the side of the transmission terminal E may function as the input terminal of the amplifier. Only one coupling transformer needs to be added to achieve the objective, and the amplifier A1 may also be implemented by a differential amplifier. So, only one coupler 202a is needed in this embodiment, as shown in FIG. 3G. In this embodiment, two inductors L1 and L2 are serially connected to a same side of the power line; the input terminal of the amplifier A1 is coupled to the starting terminal of the first inductor L1, and the output terminal of the amplifier A1 is coupled to the inverting input terminal of the amplifier A1 and the ending terminal of the first inductor; the coupler 202a is coupled to the starting terminal and the ending terminal of the inductor L1, and is disposed between the amplifier A1 and the inductor L1, wherein the coupler 202a is coupled to the noninverting input terminal of the amplifier A1 and the starting terminal of the inductor L1, and the coupler 202a is coupled to the inverting input terminal and the output terminal of the amplifier A1, and the ending terminal of the inductor L1; and the capacitor C is parallelly connected to the power line. That is, the capacitor C is parallelly connected between the ending terminal of the inductor L2 and the power line.

Figure 3H:
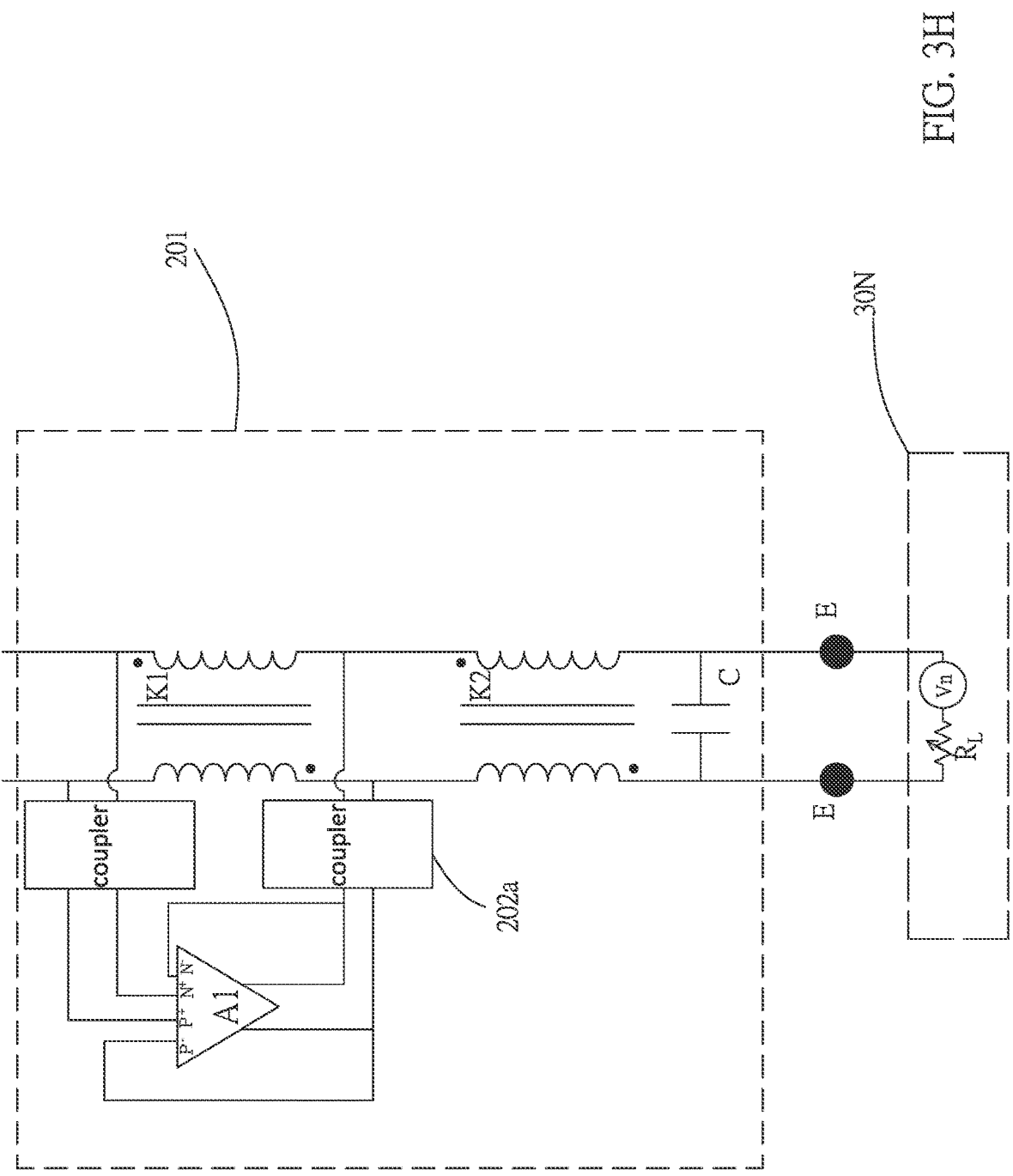

Referring to FIG. 3H, the transformers K1 and K2 in one embodiment may share an amplifier A1. So, two couplers 202a are provided in this embodiment so that the power line on two sides are respectively coupled to the same amplifier A1 through coupling paths, and the amplifier A1 has a first noninverting input terminal P, a second noninverting input terminal P, a first inverting input terminal N and a second inverting input terminal N. The isolator 201 includes two transformers K1 and K2 respectively serially connected to the power line. The amplifier A1 is coupled to the starting terminal of the primary-side coil and the starting terminal of the secondary-side coil of the transformer K1, and two output terminals of the amplifier A1 are respectively coupled between the second noninverting input terminal P and the second inverting input terminal N of the amplifier A1, and the transformers K1 and K2. The capacitor C is parallelly connected between the ending terminal of the transformer K2 and the power line. The coupler 202a is coupled to the starting terminal of the transformer K1 and the first noninverting input terminal P and the first inverting input terminal N of the amplifier A1. The other coupler 202a is coupled to the ending terminal of the transformer K1, the output terminal of the amplifier A1, the second noninverting input terminal P and the second inverting input terminal N⁻. The two second couplers 202a are disposed between the amplifier A1 and the transformer K1.

Figure 3I:
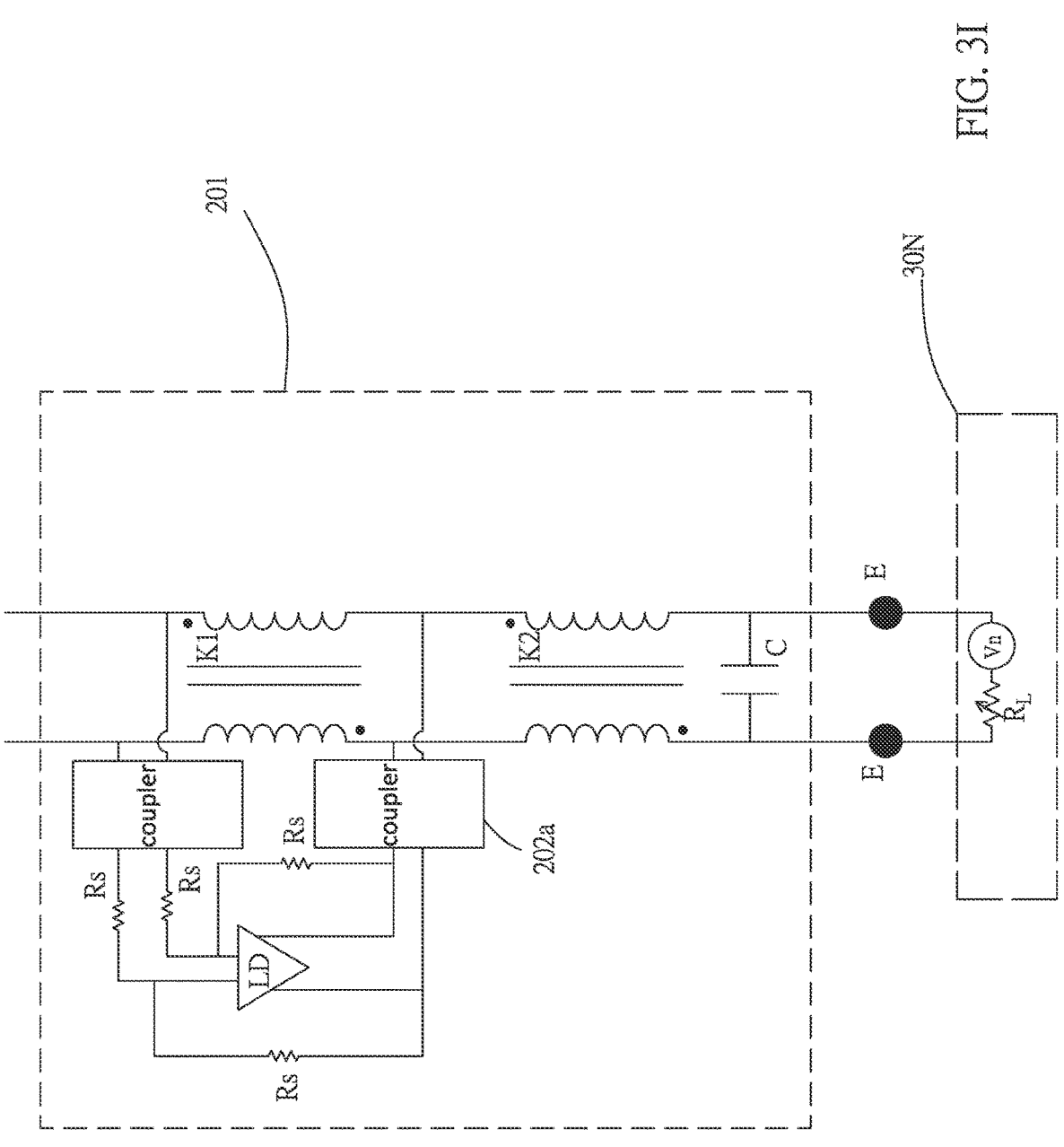

Referring to FIG. 3I, a line driver LD in one embodiment is coupled to the power line, and matching resistors Rs are disposed in feedback circuits between the input terminals and the output terminals of the line driver LD. The isolator 201 includes transformers K1 and K2 respectively serially connected to the power line. The matching resistor Rs functions as impedance matching and is coupled between the starting terminal and the ending terminal of the transformer K1. The line driver LD has input terminals coupled to the starting terminal of the transformer K1 and the matching resistor Rs, and output terminals coupled to the two input terminals of the line drivers LD and the transformer K1, the positive signal terminal of the power line is coupled to the reverse output terminal of the line driver LD, and the reverse signal terminal of the power line is coupled to the positive output terminal of the line driver LD. The capacitor C is parallelly connected to the power line. The coupler 202a is coupled to the starting terminal of the transformer K1 and the input terminal of the line driver LD, and the other coupler 202a is coupled to the ending terminal of the transformer K1 and the output terminal of the line driver LD.

In one embodiment, the isolator 14 may be implemented by the active isolators of FIGS. 3C to 3I, and the principles thereof are the same.

The architecture of this disclosure may be applied to, for example but without limitation, a long-distance power grid, a household/commercial indoor power grid, a battery-powered system network (e.g., an in-vehicle power grid or a photovoltaic power grid) and the like.

Figure 4A:
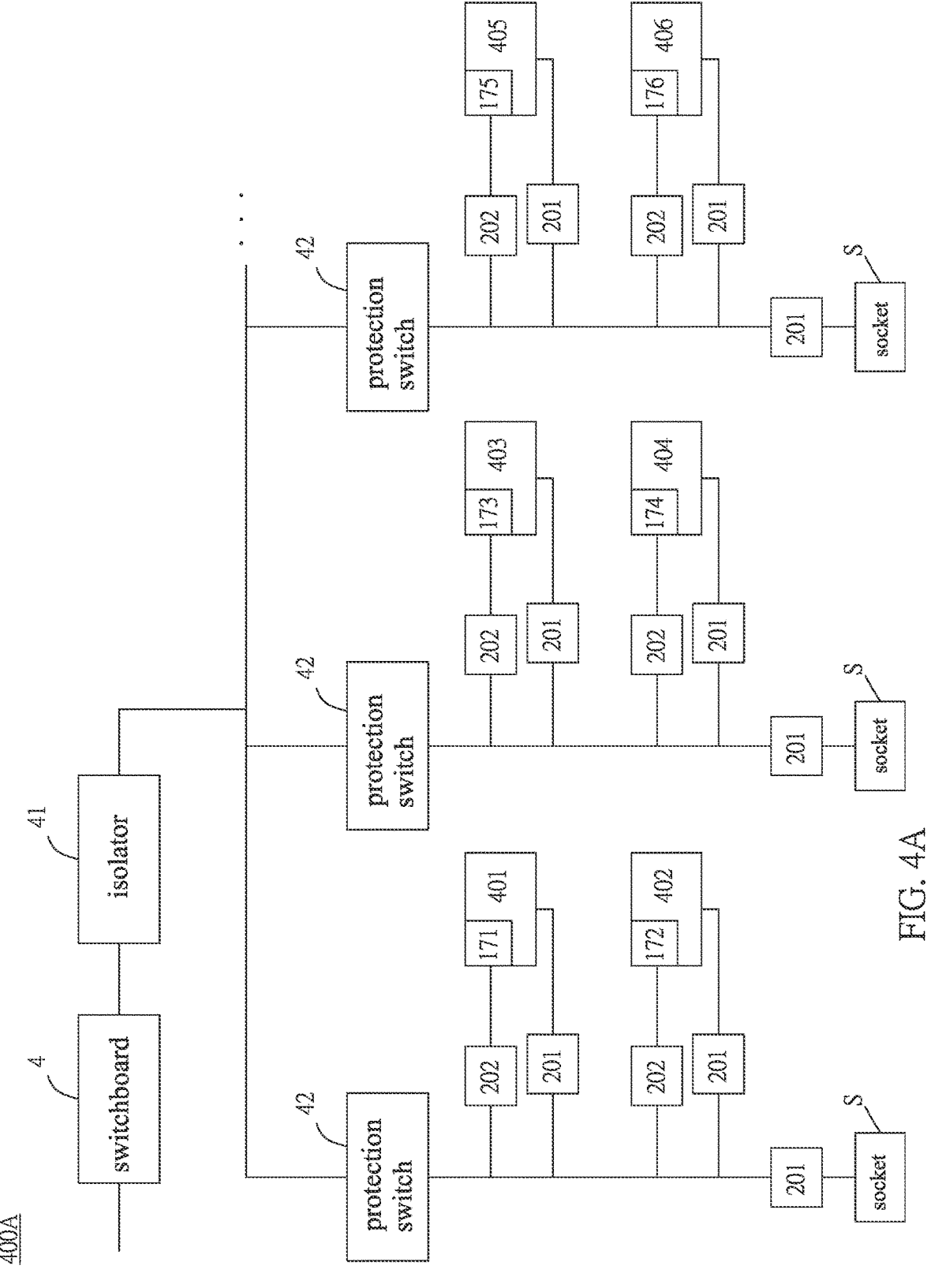
FIG. 4A is a schematic view showing the circuit structure of this disclosure used in a household indoor power grid 400A.

FIG. 4A is a schematic view showing the circuit structure of this disclosure applied to a household indoor power grid 400A. Referring to FIG. 4A, the circuit structure of this disclosure is used in the household indoor power grid 400A, and the power energy wave enters the house from the electric power company, is measured by the electricity meter, then enters the incoming line switch, and is then transmitted to a switchboard 4 through wires. The household indoor power grid 400A has multiple home appliances 401 to 406, which may be regarded as the power consumption units. Each home appliance has corresponding communication units 171 to 176. In addition, the household indoor power grid 400A includes an isolator 41, which can filter the high-frequency noise and clutters, coming from other fields or home appliances, to decrease the interference and noise of the home appliances 401 to 406, thereby protecting the home appliances 401 to 406 and circuits so that they can work stably.

In one embodiment, the isolator 41 may be implemented by a low-pass filter having a rated current of 60 A, and a protection switch 42 may be disposed in front of each field of the household indoor power grid 400A. The protection switch 42 can detect problems including the abnormal current, voltage, power and the like in the power line, and automatically cut off the power line circuit to avoid problems including apparatus overloading, short-circuiting, current leakage and the like. In one embodiment, the isolator 41 may be implemented by the active isolator in each of FIGS. 3C to 3I, and the principles thereof are the same.

Please note that, as previously mentioned, each of the home appliances 401 to 406 is coupled to the isolator 201, and the communication units 171 to 176 in the home appliances 401 to 406 are also coupled to the coupler 202, so that the power energy wave and the network signal of the household indoor power grid 400A can enter the power consumption terminal and the transmission terminal, respectively. Consequently, the network signal is transmitted to the entrances of the communication units 171 to 176 (or transmission terminals) through the coupling path, but cannot enter the side of the power consumption terminal through the isolator 201, while the low-frequency power energy wave can pass through the isolator 201 and then enter the side of the power consumption terminal. The power energy wave provides the energy to the home appliances 401 to 406, wherein other principles are the same as those described hereinabove, and detailed descriptions thereof will be omitted here.

In addition, a socket S may be disposed in the field, the socket S is coupled to the power line, and an isolator 201 is disposed between the socket S and the power line to reduce the noise and impedance caused by the socket S.

Figure 4B:
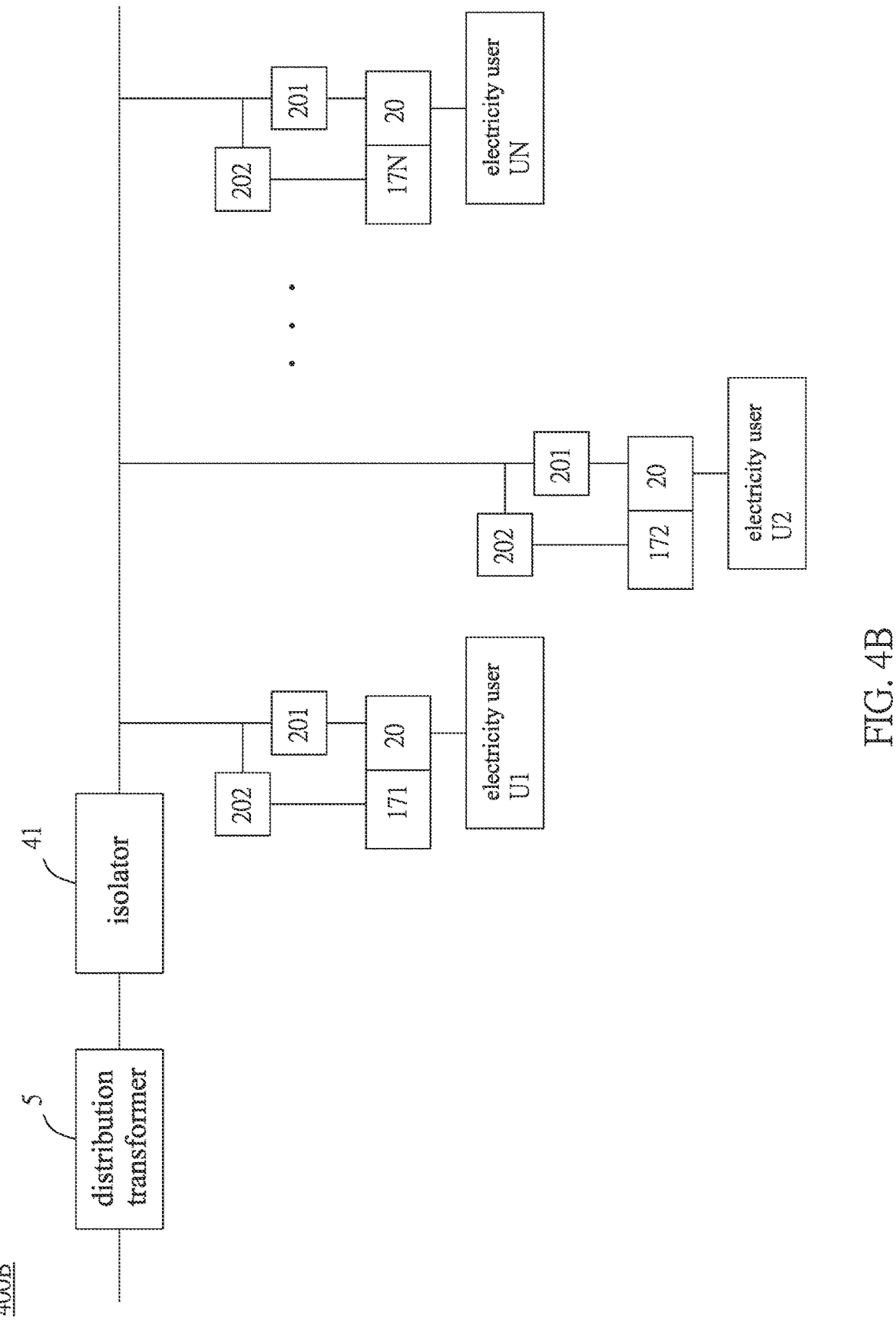
FIG. 4B is a schematic view showing the circuit structure of this disclosure used in an outdoor power grid 400B.

FIG. 4B is a schematic view showing the circuit structure of this disclosure used in an outdoor power grid 400B. Referring to FIG. 4B, the circuit structure of this disclosure is used in the outdoor power grid 400B, and the power energy wave passes through the electricity meter 20 from a distribution transformer 5, and is then transmitted to electricity users U1 to UN through the power line. The outdoor power grid 400B includes an isolator 41 capable of filtering high-frequency noise and clutters coming from other fields. As previously mentioned, the isolator 201 of this disclosure is disposed at an entrance of the electricity meter 20, and the communication units 171 to 17N are also coupled to the coupler 202. Consequently, the network signal is transmitted to entrances of the communication units 171 to 17N (or transmission terminals) through coupling paths, but cannot enter the electricity meter 20 through the isolator 201.

Figure 5:
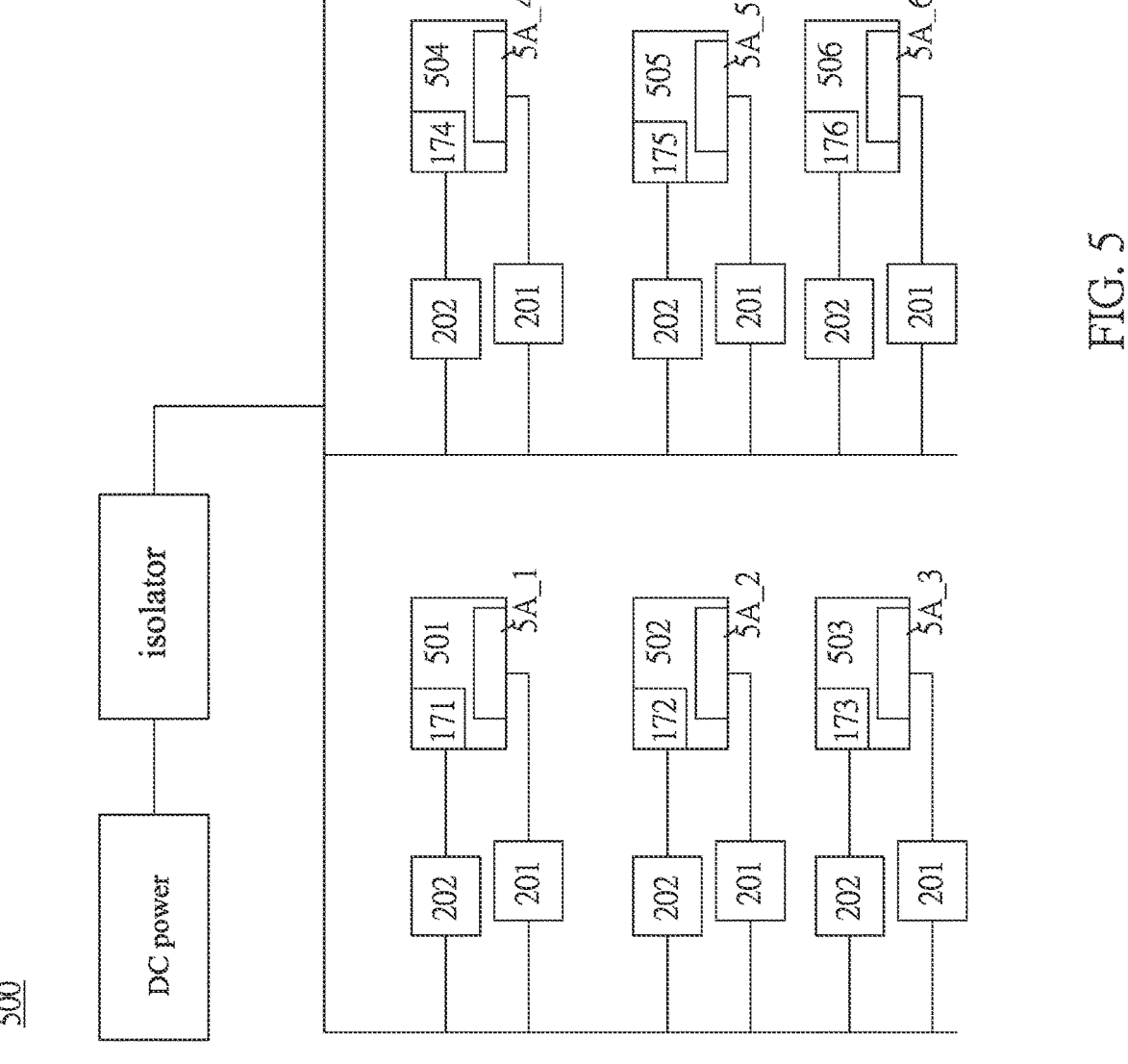
FIG. 5 is a schematic view showing the circuit structure of this disclosure used in a vehicle power grid 500.

FIG. 5 is a schematic view showing the circuit structure of this disclosure used in a vehicle power grid 500. Referring to FIG. 5, the circuit structure of this disclosure is used in the vehicle power grid 500. The DC power is used by application modules 501 to 506 of the vehicle. The application modules 501 to 506 respectively have corresponding in-vehicle power consumption units 5A_1 to 5A_6, and communication units 171 to 176 corresponding to the application modules 501 to 506, respectively.

Please note that the application modules 501 to 506 may be implemented by an engine control unit (ECU), a transmission control unit, an electronic stability program, an active cruise control (ACC) system, a car access system, a car door module, a car window module, a rearview mirror module, a global positioning system (GPS), a radio module and the like.

This embodiment is explained according to the DC power for powering the automotive application modules 501 to 506. As previously mentioned, the in-vehicle power consumption units 5A_1 to 5A_6 in the vehicle power grid 500 may be the power consumption terminals or the power consumption units, the isolator 201 is coupled to the entrance of each of the in-vehicle power consumption units 5A_1 to 5A_6, and the coupler 202 is coupled to each of the communication units 171 to 176 or transmission terminals. Consequently, the network signal is transmitted to entrances of the communication units 171 to 176 (or transmission terminals) through coupling paths, but cannot enter the side of the power consumption terminal through the isolator 201. The low-frequency power energy wave can pass through the isolator 201 and then enter the side of the power consumption terminal. The power energy wave provides the energy to the in-vehicle power consumption units 5A_1 to 5A_6. The other principles are the same as those mentioned hereinabove, and detailed descriptions thereof will be omitted here.

In addition, the ground wire of the vehicle is generally replaced by the car shell, the DC electricity is generally supplied from the power cable (line) to each application module, and then the DC electricity flows back to the battery from the car-shell ground wire nearby. If the network signal is also transmitted in the same loop, then the signal tends to radiate, and the external interference noise is also absorbed by the transmission line. So, it is more proper that the differential signal is transmitted using the cable such as twist pairs. That is, the DC current loop still inherits from the original car shell loop, but the network signal flows back through the twisted-pair loop. At this time, the differential signal transmission line can be used to serve as the same set of DC power cables or two sets of power cables (e.g., one cable of 3.3V, and the other cable of 24V), and the requirement on the power chip on each application module can be properly reduced.

The circuit structure of this disclosure may also be applied to non-PLC. That is, the communication signal is transmitted through any wire similar to the twisted pairs or coaxial cable. In addition, the above-mentioned figures are mainly schematically depicted by way of differential signal transmission, but they may also be applied to a single-end signal cable or a single-end transmission line.

In summary, regarding the low-frequency power line and the high-frequency communication signal in this disclosure, another coupling path is configured on the transmission path, so that the low-frequency power line and the high-frequency communication signal have the isolated transmission paths to improve the power line communication (PLC).

The invention claimed is:

1. A circuit structure to improve reliability of power line communication, the circuit structure having a power line, on which a power energy wave and a network signal are transmitted, the circuit structure comprising:

a first isolator, which is disposed at an entrance of a power consumption terminal of the circuit structure, separates the power line into the power consumption terminal and a transmission terminal, and filters the network signal, so that the power energy wave enters the power consumption terminal; and a first coupler for generating a first coupling path, through which the network signal enters the transmission terminal via the first coupler without passing through the first isolator, wherein power line impedance at a side of the transmission terminal is not affected by a side of the power consumption terminal.

2. The circuit structure according to claim 1, wherein time-varying noise and impedance generated by the power consumption terminal are substantially isolated at the power consumption terminal without entering the transmission terminal.

3. The circuit structure according to claim 2, wherein a cut-off frequency of the first isolator is lower than a transmission frequency of the network signal, and higher than a frequency of the power energy wave.

4. The circuit structure according to claim 3, wherein the first isolator comprises:

an inductor serially connected to the power line; and a capacitor parallelly connected to the power line, wherein the inductor is disposed at an entrance of an input terminal of the first isolator, or the inductor is disposed on an outer side of the capacitor, so that the power energy wave is firstly transmitted through the inductor and then to the power consumption terminal.

5. The circuit structure according to claim 3, wherein the first isolator comprises:

a transformer serially connected to the power line; and a capacitor parallelly connected to the power line, wherein the transformer is disposed at an entrance of an input terminal of the first isolator, or the transformer is disposed on an outer side of the capacitor, so that the power energy wave is firstly transmitted through the transformer and then to the power consumption terminal.

6. The circuit structure according to claim 3, wherein the first isolator comprises:

four inductors respectively serially connected to the power line;

a capacitor parallelly connected to the power line, wherein the inductors are disposed at an entrance of an input terminal of the first isolator, or two of the inductors are disposed on an outer side of the capacitor, so that the power energy wave is firstly transmitted through the inductors and then to the power consumption terminal.

7. The circuit structure according to claim 3, wherein the first isolator comprises:

two transformers respectively serially connected to the power line; and a capacitor parallelly connected between the power line and the transformers, wherein the transformers are disposed at an entrance of an input terminal of the first isolator, or one of the transformers is disposed on an outer side of the capacitor, so that the power energy wave is firstly transmitted through the transformers and then to the power consumption terminal.

8. The circuit structure according to claim 3, wherein the first isolator comprises:

an inductor serially connected to the power line; and an amplifier coupled to two sides of the inductor, wherein a noninverting input terminal of the amplifier is coupled to a starting terminal of the inductor, and an output terminal of the amplifier is coupled to an inverting input terminal of the amplifier and an ending terminal of the inductor.

9. The circuit structure according to claim 3, wherein the first isolator comprises:

a transformer serially connected to the power line; and two amplifiers respectively coupled to a starting terminal of a primary-side coil and a starting terminal of a secondary-side coil of the transformer, wherein output terminals of the amplifiers are respectively coupled to inverting input terminals of the amplifiers, and an ending terminal of a primary-side coil or an ending terminal of a secondary-side coil of the transformer, and noninverting input terminals of the amplifiers are respectively coupled to the starting terminal of the primary-side coil and the starting terminal of the secondary-side coil of the transformer.

10. The circuit structure according to claim 3, wherein the first isolator comprises:

two transformers respectively serially connected to the power line; and two amplifiers respectively coupled to a starting terminal of a primary-side coil and a starting terminal of a secondary-side coil of a first transformer of the transformers, wherein: output terminals of the amplifiers are respectively coupled between inverting input terminals of the amplifiers, and the two transformers; and noninverting input terminals of the amplifiers are respectively coupled to the starting terminal of the primary-side coil and the starting terminal of the secondary-side coil of the first transformer; and multiple capacitors respectively parallelly connected between the starting terminal of the primary-side coil or the starting terminal of the secondary-side coil of the first transformer, the noninverting input terminals of the amplifiers and the power line, and parallelly connected between an ending terminal of the primary-side coil of the first transformer or an ending terminal of the secondary-side coil of the first transformer, the inverting input terminals and the output terminals of the amplifiers, and the power line; wherein the power line at a high-voltage side is parallelly connected to another one of the capacitors.

11. The circuit structure according to claim 3, wherein the first isolator comprises:

two transformers respectively serially connected to the power line;

two amplifiers respectively coupled to a starting terminal of a primary-side coil and a starting terminal of a secondary-side coil of a first transformer of the transformers, wherein output terminals of the amplifiers are respectively coupled between inverting input terminals of the amplifiers, and the two transformers, wherein noninverting input terminals of the amplifiers are respectively coupled to the starting terminal of the primary-side coil and the starting terminal of the secondary-side coil of the first transformer of the transformers;

a capacitor parallelly connected between the power line at a high-voltage side, an ending terminal of a primary-side coil and an ending terminal of a secondary-side coil of a second transformer of the transformers, and the power line; and a second coupler, which is coupled to the starting terminal and the ending terminal of the first transformer, and the output terminals, the noninverting input terminals and the inverting input terminals of the amplifiers, and disposed between the amplifiers and the first transformer.

12. The circuit structure according to claim 3, wherein the first isolator comprises:

two inductors serially connected to a same side of the power line;

an amplifier, wherein an input terminal of the amplifier is coupled to a starting terminal of a first inductor of the inductors, and an output terminal of the amplifier is coupled to an inverting input terminal of the amplifier and an ending terminal of the first inductor;

a second coupler coupled to a noninverting input terminal of the amplifier and the starting terminal of the first inductor of the inductors, wherein the second coupler is coupled to an inverting input terminal and an output terminal of the amplifier, and the ending terminal of the first inductor; and a capacitor parallelly connected to the power line.

13. The circuit structure according to claim 3, wherein the first isolator comprises:

two transformers respectively serially connected to the power line; and an amplifier having a first noninverting input terminal, a second noninverting input terminal, a first inverting input terminal and a second inverting input terminal, wherein the amplifier is coupled to a starting terminal of a primary-side coil and a starting terminal of a secondary-side coil of a first transformer of the transformers, and an output terminal of the amplifier is coupled between the second noninverting input terminal and the second inverting input terminal of the amplifier, and the two transformers;

a capacitor parallelly connected between a second transformer of the transformers and the power line; and two second couplers, wherein one of the second couplers is coupled to the starting terminal of the first transformer and the first noninverting input terminal and the first inverting input terminal of the amplifier, and the other one of the second couplers is coupled to an ending terminal of the first transformer, and the second noninverting input terminal, the second inverting input terminal and the output terminal of the amplifier, and is disposed between the amplifier and the first transformer.

14. The circuit structure according to claim 3, wherein the first isolator comprises:

two transformers respectively serially connected to the power line;

four matching resistors, which function as impedance matching and are respectively coupled between a starting terminal and an ending terminal of the first transformer of the transformers;

a line driver having an input terminal coupled to the starting terminal of the first transformer and the matching resistors, an output terminal coupled to the input terminals of two of the line drivers and the first transformer, a positive signal terminal of the power line coupled to a reverse output terminal of the line driver, and a reverse signal terminal of the power line coupled to a positive output terminal of the line driver;

a capacitor parallelly connected to the power line; and two second couplers, wherein one of the second couplers is coupled to the starting terminal of the first transformer and the input terminals of the line driver, and the other one of the second couplers is coupled to the ending terminal of the first transformer and the output terminals of the line driver.

* * * * *